United States Patent [19]

Spence

[11] Patent Number: 4,686,652
[45] Date of Patent: Aug. 11, 1987

[54] NON-VOLATILE RAM CELL WITH SINGLE HIGH VOLTAGE PRECHARGE

[75] Inventor: John R. Spence, Villa Park, Calif.

[73] Assignee: Rockwell International Corporation, El Segundo, Calif.

[21] Appl. No.: 801,650

[22] Filed: Nov. 25, 1985

[51] Int. Cl.$^4$ ............................................. G11C 8/00
[52] U.S. Cl. ................................. 365/230; 365/154; 365/185; 365/203
[58] Field of Search .............. 365/154, 149, 189, 203, 365/230, 185

[56] References Cited

U.S. PATENT DOCUMENTS

| | | | |
|---|---|---|---|
| 4,091,460 | 5/1978 | Schuermeyer et al. | 365/154 |
| 4,271,487 | 6/1981 | Craycraft et al. | 365/189 |
| 4,375,086 | 2/1983 | Van Velthoven | 365/149 |
| 4,510,584 | 4/1985 | Dias et al. | 365/203 |
| 4,545,035 | 10/1985 | Guterman et al. | 365/185 |

Primary Examiner—James W. Moffitt
Attorney, Agent, or Firm—H. Fredrick Hamann; George A. Montanye; James F. Kirk

[57] ABSTRACT

A memory cell circuit for storing the state of a digital signal on a data bus in response to an address signal. The memory cell has a store cycle with a repeating series of recurring store cycle sequences, each store cycle sequence having a (HIV) high-voltage timing signal during a first interval, and first and second store timing signals. The memory cell circuit also has a recall cycle. Each recall cycle has a memory reset signal to pre-set the state of the memory cell circuit during a first interval, a recall output signal at a predetermined voltage level and a recall transfer signal. The memory cell comprises a volatile RAM cell having a flip-flop providing an output signal at an output terminal. The flip-flop also has a RESET TERMINAL responsive to a reset signal for forcing the flip-flop to assume a predetermined state in response to the memory reset signal and a SET TERMINAL responsive to a set signal for setting the state of the volatile RAM cell in a recall sequence. A non-volatile RAM element has a rectifier capacitor means responsive to the high voltage timing signal for precharging to a first state during the first timing interval of each store cycle. Transfer control circuit means is responsive to the first store timing signal to discharge the capacitor in response to the flip-flop output signal being in a first state. The capacitor remains precharged in response to the flip-flop output signal being in a second state. A charge storage memory stores a state corresponding to the charge state of the capacitor into a non-volatile charge storage element. The charge storage memory provides a set signal corresponding to the state of the capacitor. The transfer control circuit couples the set signal to set the state of the flip-flop to correspond to the charged state of the charge storage device.

11 Claims, 22 Drawing Figures

NON-VOLATILE RAM CELL WITH SINGLE HIGH VOLTAGE PRECHARGE

FIELD OF THE INVENTION

This invention relates generally to electronic memory circuitry and pertains particularly to non-volatile random access memory.

BACKGROUND OF THE INVENTION

Electronic semiconductor memories are used in computers and other devices for storing information. The information is encoded into binary bits, which are stored in cells of the memory, with the value of each bit being represented by the electrical state of a cell. An electronic memory may be of the random access type, which readily allows changes to be made in the stored information, or of the read only type, which does not.

A computer is supplied with power from an external source, such as a battery or a connection to a utility power line. The power supplied to the computer generally is also supplied to the memories within the computer. For many applications, it is desirable that the information stored in a memory not be lost when the source of power (i.e. battery or utility power) is disconnected from the memory. For example, if a lengthy program is stored in a computer memory, it may be desirable that the program not be lost when the computer power is shut down, so that the program will be present in the memory when the computer power is turned on again. Memories that maintain their contents after loss of power are termed "non-volatile." Ferrite core memories are exemplary of non-volatile memories.

Memories that lose their contents after loss of power are termed "volatile". Semiconductor random access memories (RAMs) made using simple MOSFETs (metal oxide semiconductor field effect transistors) are exemplary of volatile memories. Generally, volatile memories are capable of high speed, low power operation, whereas non-volatile random access memories (NVRAMs) require more power and operate at lower speeds. Various specialized electronic semiconductor memories, including electrically-alterable read only memories (EAROMs) or electrically erasable programmable read only memories (EEPROMs), have been made to allow in-circuit changes in the data stored in read only memories. However, such devices generally require large amounts of time for reprogramming.

PRIOR ART

Others have recognized the need to combine the speed and low power consumption of a typical MOSFET RAM with a non-volatile memory capability. A reference discussing several possible solutions is U.S. Pat. No. 4,271,487, issued June 2, 1981 to Donald G. Craycraft et al, and assigned to NCR Corporation. That patent describes three circuits that are associated with a conventional volatile RAM element to provide non-volatile memory associated with each RAM element. Each of those circuits includes a pair of non-volatile capacitors for storing charges representative of the memory element state to be stored. Each non-volatile capacitor is connected to one of the output nodes of the volatile memory cell and includes a threshold alterable portion. The state of the volatile RAM element is stored in the non-volatile capacitors. The threshold of the threshold-alterable portion of one or the other of the capacitors is altered, depending on the state being stored. When the power is again connected to the memory cell, and the state stored in the non-volatile portion is to be re-transferred to the volatile element, the threshold-alterable portion is turned on in one capacitor, and in the other capacitor the threshold portion is kept off, causing the two capacitors to present different capacitances to the two volatile RAM output nodes. As a result, the voltage of the two output nodes will rise at different rates. This difference in the rate of voltage rise causes the volatile portion of the element to assume the state represented by the stored charges.

The component values and tolerances for the capacitive volatile/non-volatile RAM cell of this type must be very carefully controlled to insure that the proper capacitance is applied to the cell so that the state of the cell is accurately stored on the non-volatile element and, more critically, accurately read out from the non-volatile element onto the volatile element. Slight changes or inaccuracies in the storage capacitors may result in an undesirable change in the rate of voltage rise for one or both sides of the volatile memory element, leading to inaccuracies in rewriting the volatile element.

U.S. patent application having Ser. No. 745, 746, titled "Non-volatile RAM Cell w/Charge", filed June 17, 1985 having a common assignee is of interest because it shows a non-volatile memory cell current having a volatile RAM flip-flop that has first and second stable states and means for establishing the flip-flop in its first stable state. The memory cell further includes a non-volatile RAM element having two states. A transfer circuit connected to the flip-flop and to the non-volatile element causes the flip-flop to either retain its established first state or flip to its second state in response to the state of the non-volatile element. Preferably, the non-volatile element includes a terminal that is caused to have a predetermined voltage when the non-volatile element is in its second state, corresponding to the second state of the flip-flop. The transfer circuit selectively connects the volatile element to the terminal, after the flip-flop has been established in its first state, so that when the terminal has the predetermined voltage the flip-flop changes to its second state.

The charge storage device is preferably a dielectrically isolated grid MOSFET.

To non-volatilely store a data bit, the state of the data bit is transferred to a volatile flip-flop memory cell having two stable states. That flip-flop state is transferred to a non-volatile cell, and a charge representative of that state is stored on a charge storage device. To retrieve the non-volatilely stored bit, the flip-flop is preset to a predetermined state. The charge on the charge storage device is sensed to cause the volatile cell to complement the state or allow the state to remain in its predetermined state, depending on the charge stored on the charge storage device.

SUMMARY OF THE INVENTION

It is an object of this invention to provide a non-volatile random access memory providing accurate, high-speed, low power operation.

Another object of this invention is to provide a semiconductor memory. requiring relatively few and compact components so that the memory circuitry may readily be incorporated in a high density integrated circuit chip.

A further object of the invention is to provide, in a memory cell incorporating a high speed volatile RAM cell with an associated non-volatile cell, direct and positive transfer of the state of the non-volatile cell to the volatile cell.

Yet another object of the invention is to provide reliable transfer of data between a volatile RAM cell and an associated non-volatile memory cell using a minimum of power.

The memory cell circuit of the invention stores the first or second state of a digital signal on a data bus in response to being addressed by an address signal on an address bus.

The memory cell has a store cycle and a recall cycle. The cell is responsive to high voltage timing signal (HIV) during a first store cycle interval, and to first and second store timing signals during second and third store cycle timing intervals in a store cycle sequence from a timing signal means (not shown) for the control of a store cycle timing sequence. The memory cell circuit is also responsive to a memory reset signal from a reset signal means in a first reset signal interval and to a recall output signal and a RECALL TRANSFER signal in a second reset signal interval to control a recall timing sequence. The memory cell comprises a volatile RAM cell having a flip-flop providing an output signal at an output terminal. The output signal assumes a first or second stable state corresponding to the state of the data bus when addressed by an address signal on the address bus in the store timing sequence.

The flip-flop also has a reset terminal responsive to a memory reset signal for forcing the flip-flop to assume a predetermined state, and a set terminal responsive to a set signal for pre-setting the state of the volatile RAM cell in a recall sequence.

A non-volatile storage memory element is included having a rectifier capacitor means responsive to the high voltage timing signal in the store timing signal sequence for precharging a capacitor to a first state during the first timing interval of each store cycle.

A transfer control circuit means is responsive to the first timing signal in the store cycle sequence to control the store timing sequence, the transfer control circuit means is next responsive to the first store timing signal to discharge the capacitor in response to the flip-flop output signal being in a first state or it allows the capacitor to remain precharged in response to the flip-flop output signal being in a second state.

The non-volatile storage memory element also has a charge storage memory responsive to the charge state of the capacitor and to the second store timing signal for storing a state corresponding to the charge state of the capacitor into a non-volatile charge storage element.

At the start of a recall sequence, the charge storage memory. is responsive to the recall output signal in the recall timing sequence to provide a set signal having a state corresponding to the stored state of the capacitor.

The transfer control circuit means responds to the RECALL TRANSFER signal in the recall sequence by coupling the set signal to the set terminal to set the state of the flip-flop to a state corresponding to the charged state of the charge storage device.

DESCRIPTION OF THE PREFERRED EMBODIMENT

Figure 8:
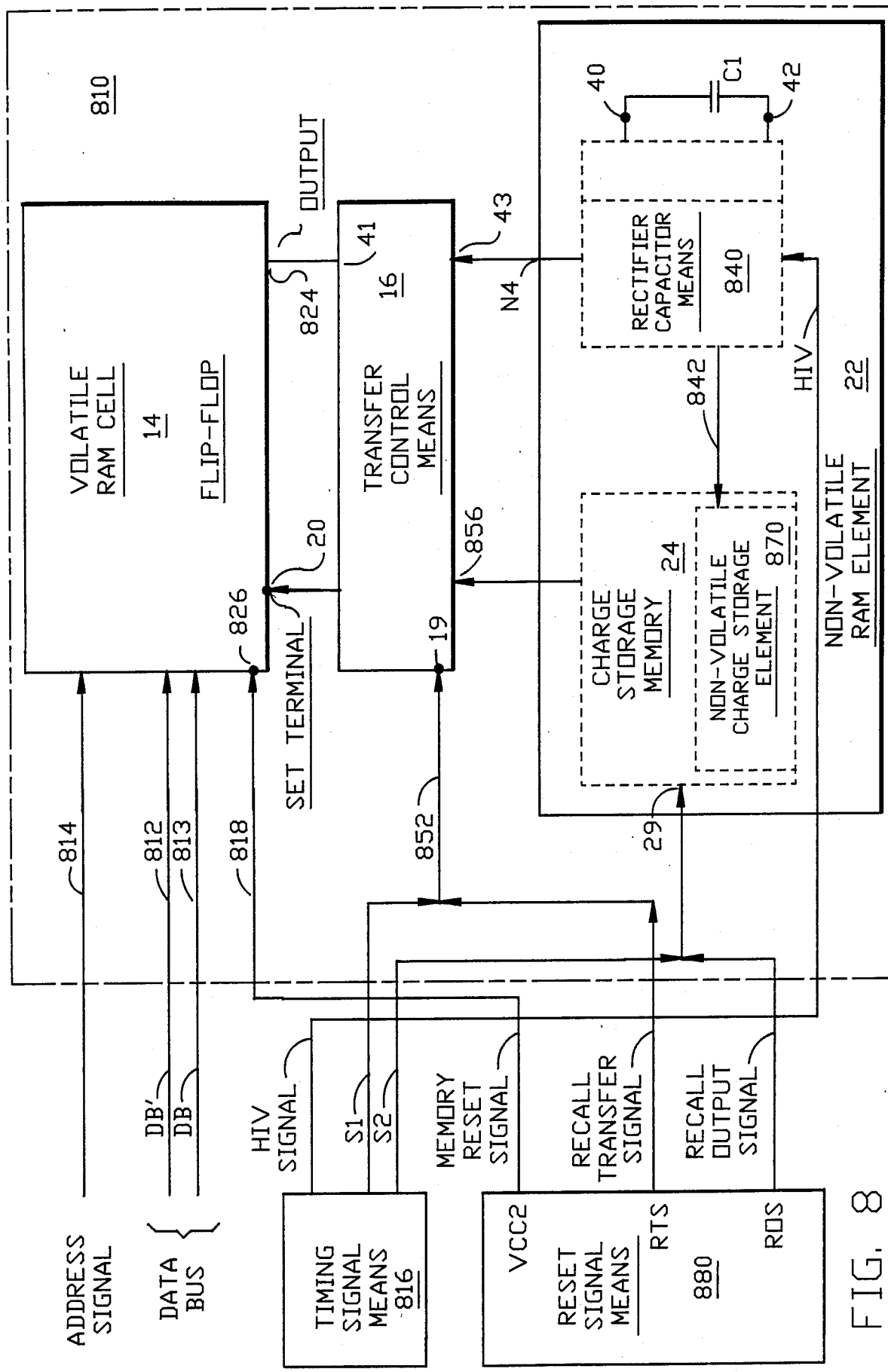
FIG. 8 is a block diagram of the invention memory cell circuit.

Referring to the drawings, FIG. 8 is a block diagram of the memory cell circuit 810 for storing the first or second state of a digital signal on a data bus such as data bus lines 812, 813 in response to being addressed by an address signal on an address bus such as signal line 814.

Figure 2:
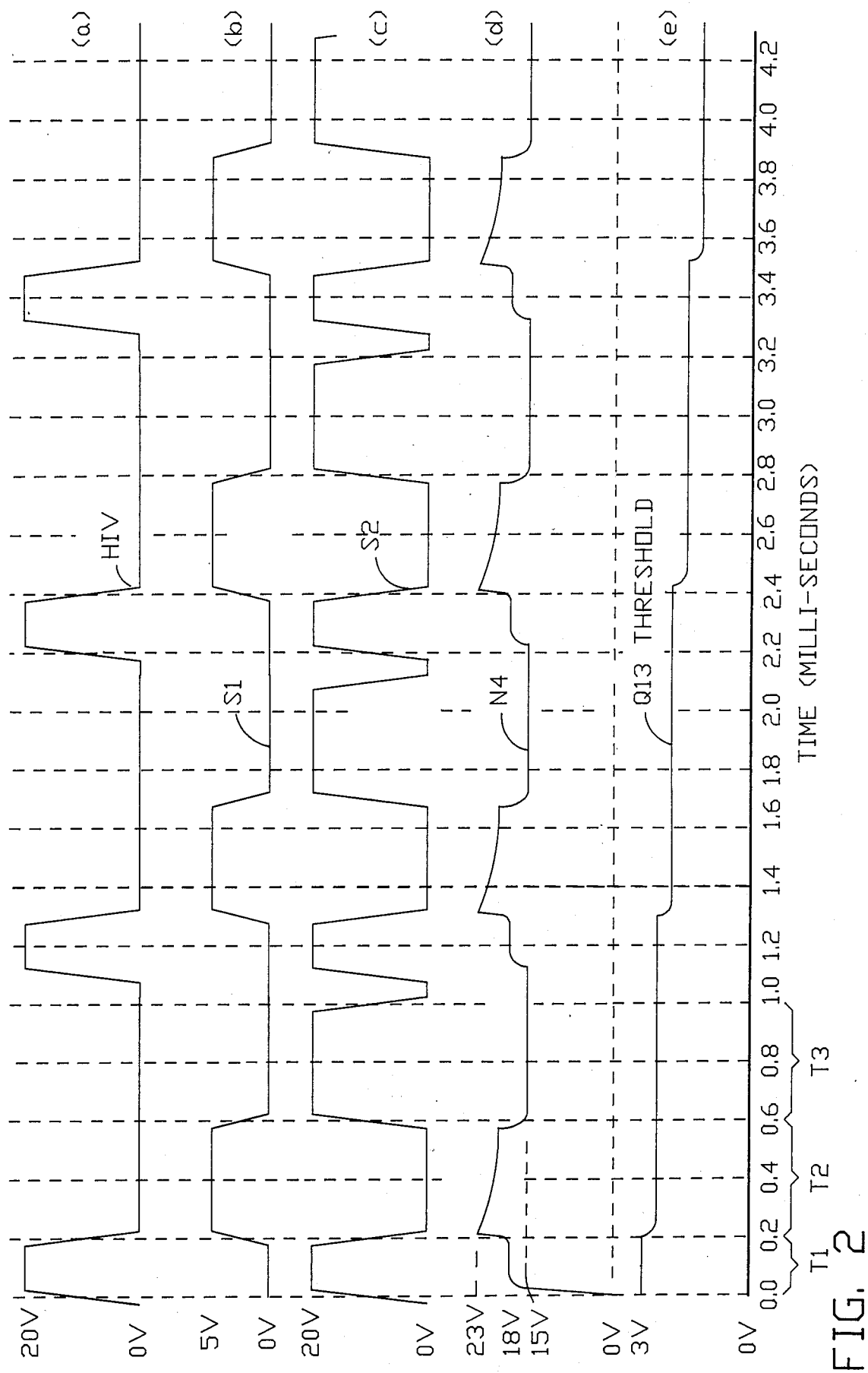
FIGS. 2a to 2e is a timing diagram for the store cycle waveforms for storing a logic one in the non-volatile memory cell, in which the voltage axis is displayed vertically and the time axis is displayed horizontally.
Figure 3:
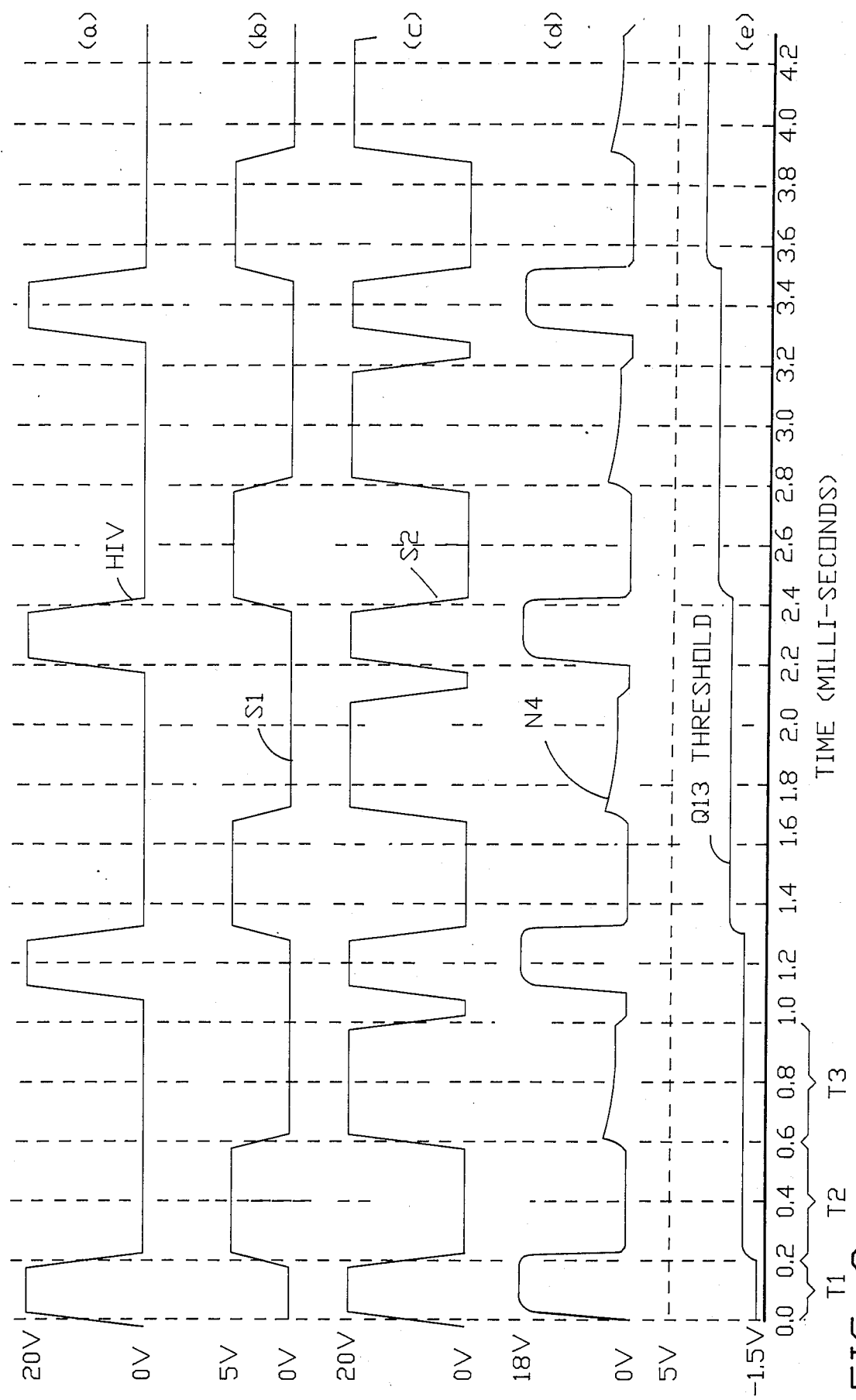
FIGS. 3a to 3e is a timing diagram for the store cycle waveforms for storing a logic zero in the non-volatile memory cell, in which the voltage axis is displayed vertically and the time axis is displayed horizontally.

Referring to FIGS. 2 and 3, the memory cell 810 has a store cycle for a logical "1" and a logical "0" partially represented by the waveforms a-e. Each store cycle has a repeating series of recurring store cycle sequences such as the sequence including intervals T1, T2 and T3. Each store cycle sequence has an HIV (high-voltage) timing signal such as waveform (a) during a first interval T1 and first and second store timing signals, S1 and S2 respectively, during second and third timing intervals T2 and T3 in a store cycle sequence from a timing signal means 816 for the control of a store cycle timing sequence T1, T2 and T3.

FIG. 2 shows four store cycle sequences over an interval lasting 4.2 ms. Nine (9) or ten (10) sequences are typically used.

The memory cell circuit 810 also has a recall cycle. FIGS. 4a–4g shows the sequence of a typical recall cycle. Each recall cycle has a memory reset signal such as VCC2 waveform (c), to pre-set the state of the volatile RAM memory cell, i.e. FLIP-FLOP circuit 14 during a first interval, such as R1. The circuit 810 also receives a recall output signal such as waveform (g) shown in FIG. 4 at a predetermined voltage level (2.0 V) and a RECALL TRANSFER signal such as waveform (f) in a second reset signal interval, such as R2 from the timing signal means (816). These three recall sequence signals control the recall timing sequence.

Figure 1:
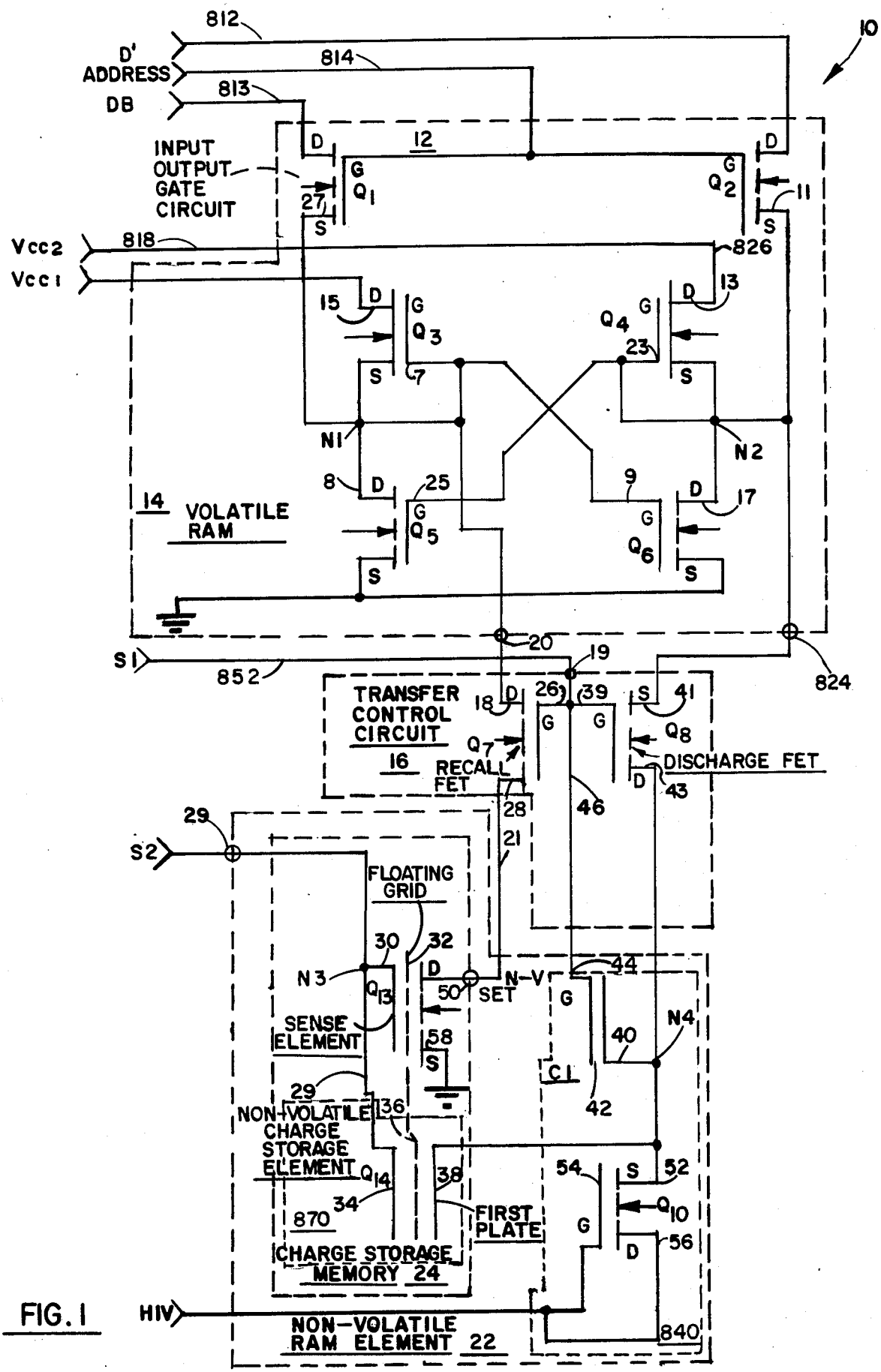
FIG. 1 is an electrical schematic drawing of the circuitry for the preferred embodiment of the non-volatile random access memory cell incorporating the invention.

The volatile RAM cell is characterized by functional block 14 having a flip-flop that provides an output signal (not shown) at an output terminal N2 shown in FIG. 1. The output signal is characterized to assume a first or second stable state such as a logic "1" at +5.0 V or a logic "0" at 0.0 V, corresponding to the state (logic "1" or logic "0") of the data bus, in response to an address signal on the address bus 814.

The flip-flop 14 also has reset terminal 826 responsive to a reset signal VCC2 on signal line 818 for forcing flip-flop to assume a predetermined state in response to the memory reset signal VCC2 characterized by waveform (c) in FIG. 8. FIG. 8 also shows the flip-flop having a set terminal responsive to a set signal (not shown)

for setting the state of the volatile RAM cell in a recall sequence.

The memory cell 810 of FIGS. 4a to 4g also includes a non-volatile storage memory element represented by block 22 having a rectifier capacitor means, represented by phantom block 840. This element is responsive to the high voltage timing signal (HIV) in the store timing signal sequence for precharging a capacitor to a first state during the first timing interval of each store cycle. The HIV signal is depicted as waveform (a) in FIGS. 2 and 3.

Transfer control circuit means, represented by block 16, is responsive to the first timing signal in the store cycle sequence characterized by waveform (b) in FIGS. 2 and 3 to control the store timing sequence. Continuing our discussion of FIG. 8, the first timing signal (b) is received on signal line 852 at terminal 19. The transfer control means 16 is responsive to the first store timing signal characterized by waveform (b) to discharge the capacitor (C1) in rectifier capacitor means 840 in response to the flip-flop output signal (not shown) being in a first state (i.e. 0.0 V). The transfer control circuit means allows the capacitor C1 to remain precharged in response to the flip-flop output signal being in a second state (i.e. +5.0 V).

The non-volatile RAM element 22 of FIG. 8 is further characterized to have a charge storage memory represented by PHANTOM BLOCK 24. This element is responsive to the charge state of the capacitor C1 shown in FIG. 1 and to the second store timing signal, waveform (c), for storing a state corresponding to the charge state of the capacitor C1 into a non-volatile charge storage element, represented by phantom block 870 via signal line 842. The charge storage memory 24 is responsive to the recall output signal in the recall timing sequence of FIG. 4 to provide a set signal (not shown) to terminal 856 having a state corresponding to the stored state of the capacitor C1.

The transfer control circuit means 16 is responsive to the RECALL TRANSFER signal in the recall sequence to couple a signal to the set terminal 20 to set the state of the flip-flop during the recall timing signal sequence to a state corresponding to the charged state of the charge storage device.

The charge storage memory non-volatile charge storage element 870 is a semiconductor device such as FET Q24 shown in FIG. 1 that has a dielectrically isolated grid having a charge established in response to the charge state of the capacitor following the second timing interval in a store timing sequence. FIG. 1 shows a more particular alternative embodiment in which FET Q14 represents the non-volatile charge storage element and in which the dielectrically isolated grid is represented by grid 36.

The dielectrically isolated grid charge characterizes the previously stored state of the non-volatile RAM element shown as phantom block 22.

Figure 5:
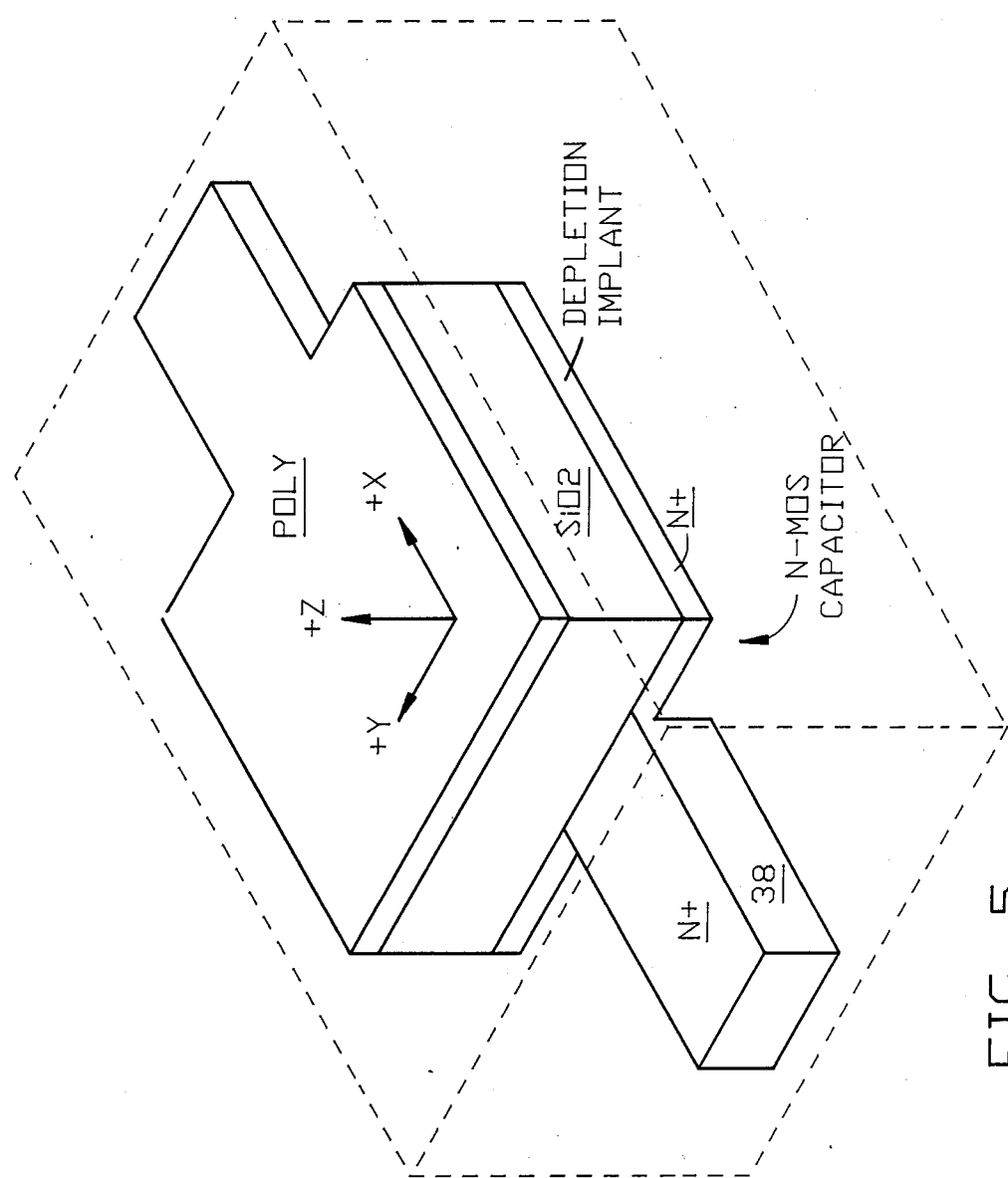
FIG. 5 is a perspective view of a semiconductor capacitor structure showing the relative position of diffused elements.

Referring again to FIG. 8, the non-volatile RAM element rectifier capacitor means is represented by phantom block 840 and further comprises a capacitor, such as C1, having a first and second terminal, such as 40, 42, and a rectifier. FIG. 5 characterizes the embedded construction of a typical capacitor in a perspective view showing a first plate (lower) coupled via a diffused conductor 38 to other nodes. The lower plate is typically of heavily doped N material. The dielectric is $SiO_2$.

FIG. 1 shows the rectifier Q10. The rectifier Q10 is responsive to the high voltage timing signal HIV in the store timing sequence of FIG. 2 and FIG. 3 for conducting current in a first direction to the capacitor first terminal. Referring again to FIG. 8, the capacitor C1 second terminal 42 is coupled by the second timing signal source to a reference potential such as ground during the first timing interval. The high voltage timing signal HIV is further characterized to charge on the capacitor during the second and third timing intervals shown in FIGS. 2 and 3.

In an alternative embodiment, the rectifier capacitor means 840 comprises a capacitor having a first and second terminal 40, 42, and the transfer control means couples the capacitor first terminal to the flip-flop output terminal 824 during the second store timing interval to discharge the precharged capacitor C1 in response to the flip-flop 14 being in a first state and to not discharge the capacitor in response to the flip-flop being in a second state.

Referring to FIG. 1, phantom block 24 represents the charge storage memory within the non-volatile RAM element 22. A non-volatile RAM element is shown having a dielectrically isolated grid 36, a first plate 38 and a second plate 34, and the non-volatile RAM element rectifier capacitor means has a capacitor C1 having a first and second terminal 40, 42 respectively. The non-volatile RAM element Q14 first plate 38 is coupled to the capacitor first terminal 40 and the second plate 34 is coupled to the store cycle second timing signal via signal line 29 to S2. The sensing element Q13 has a second dielectrically isolated grid FET having a dielectrically isolated grid 32 coupled to the dielectrically isolated grid 36 of the non-volatile RAM element Q14. The channel of Q13 is coupled between a reference potential such as ground and the non-volatile element set terminal 48.

Figure 4:
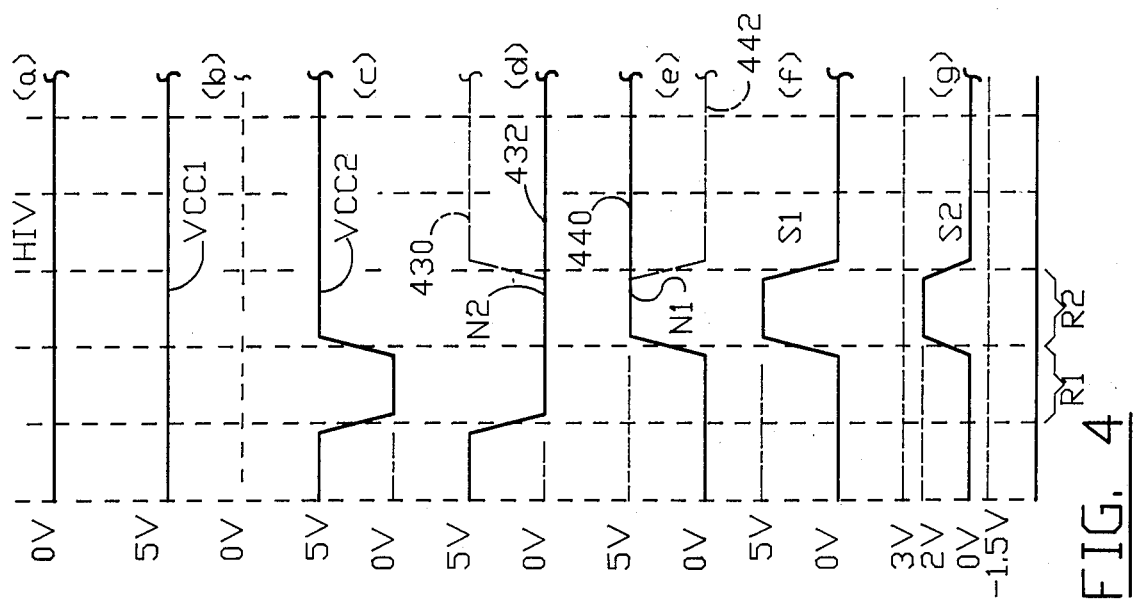
FIGS. 4a to 4g is a timing diagram for the recall cycle waveforms for the memory cell, in which voltage amplitude is displayed vertically and time is displayed horizontally.

Sensing element Q13 is responsive to the charge on the dielectrically isolated grid 36 and to the recall timing signal sequence of FIG. 4 for selectively establishing a predetermined voltage on the non-volatile RAM element output terminal 50.

A sensing element means, such as Q13, has a dielectrically isolated grid 32 coupled to the charge on the dielectrically isolated grid 36. The second recall timing signals sequence includes signal S2 of FIG. 4 (waveform (g)). Signal S2 selectively establishes a predetermined voltage, such as 0.0 V or ground, on the non-volatile element output terminal 50. The transfer control circuit means further comprises a RECALL FET, such as Q7. The RECALL FET has a gate and a conduction channel having a first and second terminal, such as its drain (D) and source (S).

The RECALL FET gate is responsive to the RECALL TRANSFER signal, such as S1 in FIG. 4, to couple the non-volatile element output terminal 50 to the volatile RAM set terminal 20.

The charge storage memory within the non-volatile storage memory element is more particularly described in cooperation with FIG. 1 as having a non-volatile RAM element, such as Q14 having dielectrically isolated grid 36, first plate 38, and second plate 34. The non-volatile RAM element Q14 first plate 38 is coupled to the capacitor first terminal 40 and the second plate is coupled to the second timing signal S2.

The sensing element is represented by FET Q13. This element has a gate 30, dielectrically isolated grid 32, and conduction channel between its (D) and source (S). The dielectrically isolated frid of Q13 is coupled to the dielectrically isolated grid of non-volatile RAM element Q14. The channel of Q13 is coupled between a reference potential such as ground and the non-volatile element output terminal 50.

The sensing element 1 Q13 gate is coupled to receive the recall output signal S2 of approximately 2.0 V as shown in waveform (g) of FIG. 4 for selectively establishing a predetermined voltage on a non-volatile element output terminal 50.

The RECALL FET Q7 has gate 26 and a conduction channel having first and second terminals 18, 28 respectively. The RECALL FET gate is responsive to the RECALL TRANSFER signal from the S1 source as shown in waveform (f) of FIG. 4, to couple the non-volatile element output terminal 50 to the volatile RAM set terminal 20. The flip-flop 14 is responsive to the reset signal at 826 for forcing the flip-flop to assume a predetermined state in response to the memory reset signal. Set terminal 20 is responsive to a set signal for setting the state of the volatile RAM cell 14 in a recall sequence. The non-volatile storage memory element 22 rectifier capacitor means (Q10, C1) phantom clock 840 is responsive to the high voltage timing signal HIV in the store timing signal sequence for precharging a capacitor (such as C1) to a first state (+20 V) at the start of each store cycle. The rectifier means has a field effect transistor Q10, a conduction channel having a first and second terminal (52, 56) and a gate 54. The first terminal 52 is coupled to the capacitor first terminal 40. The second terminal 56 is coupled to the gate (G) and to the high voltage input signal source (HIV).

Charge storage memory 24 is responsive to the charge state of the capacitor C1 and to the store sequence second store timing signal S2 (FIGS. 2 and 3) for transferring the state of the flip-flop 14 into a non-volatile charge storage element Q14. The charge storage memory is responsive to the recall output signal in the recall timing sequence to provide a set signal having a state corresponding to the stored state of the capacitor. The transfer control circuit means is responsive to the first timing signal S1 in the recall sequence to couple the set signal to the set terminal 20 to set the state of the flip-flop during the recall timing signal sequence to a state corresponding to the charged state of the charge storage device. The transfer control circuit means is responsive to the first timing signal in the store cycle sequence to control the store timing sequence. The transfer control circuit means 16 is responsive to the first store timing signal S1 to discharge the capacitor C1 in response to the flip-flop being in a first state, such as a logic "0", and allowing the capacitor to remain precharged in response to the flip-flop output signal being in a second state.

Referring to FIG. 1, the transfer control means 16 has RECALL FET (field effect transistor) Q7. The RECALL FET has gate 26 and a conduction channel having a first and second terminal, such as drain 18 and source 28 respectively. The RECALL FET gate 26 is responsive to the first recall timing signal from terminal S2 to couple the non-volatile element output terminal 50 to the volatile RAM flip-flop reset terminal 20.

In another more particular embodiment, the flip-flop has a reset terminal, such as terminal 826 responsive to a recall cycle memory reset signal at the VCC2 input for forcing the flip-flop to assume a predetermined state, in response to the memory reset signal, such as waveform (c) in FIG. 4.

Referring to FIG. 1, the flip-flop 14 has first and second I/O FE (field effect transistors), such as Q2 and Q1. Each FET I/O a respective gate, source and drain. The first and second I/O FET have respective drains coupled to respective complementary data bus signal lines DB' and DB respectively. The gates of the I/O FETS are coupled to the address signal line 814. The flip-flop also has first and second P/U (pull up) FETS such as Q4 and Q3 and first and second state FETS Q6 and Q5 respectively. The first P/U FET drain 13 is coupled to the flip-flop reset terminal 826 to receive the memory reset signal. The second P/U FET drain 15 is coupled to a constant supply voltage source such as VCC1.

The first state FET Q6 drain 17 is coupled to the first P/U FET Q4 source and gate 23, to the second state FET Q5 gate 25, to the first I/O FET Q2 source 11, and to the flip-flop set terminal 824. The second state FET Q5 drain 8 is coupled to the second P/U FET Q3 source and gate 7, to the first state FET Q6 gate 9, to the second I/O FET Q1 source and to the second I/O FET Q1 source 27.

Non-volatile storage memory element 22 has a RECALL FET Q7; a discharge FET Q8; a capacitor C1 having a first and second terminal; a charge storage element, such as Q14 having a dielectrically isolated grid 36, a first and second plate 38, 34; and a sensing element FET Q13 having a dielectrically isolated grid 32. The dielectrically isolated grids are electrically coupled to the charge storage element dielectrically isolated grid 36. Each FET Q7 has a source, a gate and a drain. The RECALL FET drain 18 is coupled to the flip-flop set terminal 20. The discharge FET source 41 is coupled to the flip-flop output terminal 824.

The recall and discharge FET gates 26, 39 are coupled to receive the first store and the first RECALL TRANSFER signals during the second interval in respective store and recall timing sequences. The capacitor C1 has a first terminal 40 coupled to the discharge FET drain 43, to the source of the rectifier FET 52 and to the first plate of the non-volatile RAM element 38. The capacitor second terminal 42 is coupled to the junction of the recall and discharge TRANSFER FET grids 26, 39. The second plate of the non-volatile RAM element 34 is coupled to the gate 30 of the sensing element FET and to the source of the second store and recall output timing signals S2.

The source of the sensing element FET Q13 is coupled to a reference potential such as ground, and the drain of the sensing element is coupled to the source of the transfer reset FET 28.

OPERATION

The Gate Circuit 12

Referring to FIG. 1, an embodiment of the flip-flop 14 is shown using N-MOS devices in which the input-/output gate circuit 12 controls the transfer of data to and from the volatile RAM element 14. The gate circuit 12 is preferably substantially conventional and includes I/O FETs Q1, Q2 having their gate electrodes connected to an external ADDRESS signal line 814. Transistor Q1 has its channel connected between a data bus line (DB) and a first node N1 of a volatile RAM element 14. Transistor Q2 has its channel connected between an inverted data bus line (DB' and a second node N2 of the volatile memory element 14. Thus, an external computer data bus circuit can be connected to the memory cell by signal lines DB, 813 and DB', 812.

External electrical addressing signals may be applied to the ADDRESS line to turn the transistors Q1 and Q2 on and off and thus control the transfer of data to and from the memory cell. The I/O FETs Q1, Q2 are preferably enhancement mode n-channel FET. The I/O FETs Q1, Q2 are off (or non-conductive) when the ADDRESS line is zero volts, and are on (or conductive) when the ADDRESS line is approximately five volts.

When the I/O FETs Q1, Q2 are off, electrical signals are not allowed to flow between data bus line DB and a first node N1 of the memory, nor between the inverted data bus line DB' and a second node N2 of the memory. When the I/O FETs Q1, Q2 are on, electrical signals are allowed to flow back and forth between the line DB and the first node N1, and between the line DB and the node N2.

The Volatile Memory Element 14

The volatile RAM element, i.e. flip-flop 14 is substantially similar to a conventional static RAM having two stable states and two nodes N1, N2. Each stable state of the volatile element 14 represents one of the two possible states for the bit stored in that element.

In one stable state, the voltage on the first node N1 is high relative to the voltage on the second node N2. In the other stable state of the volatile memory element 14, the voltage on the first node N1 is low relative to the voltage on the second node N2. The state of the memory cell is determined by the transistors Q3, Q4, Q5, Q6, which are controlled by the signals received on the data bus lines DB, DB'.

In its preferred form, the volatile RAM element, i.e. flip-flop 14 has n-channel depletion mode FETs Q3 and Q4, and n-channel enhancement mode FETs Q5 and Q6. The FET Q3 has its channel connected between a first voltage source line VCC1 and the first node N1, and has its gate 7 connected to the node N1. The FET Q4 has its channel connected between a second voltage source line VCC2 and the second node N2, and has its gate 23 connected to the node N2. The FET Q5 has its channel connected between the first node N1 and ground, and has its gate 25 connected to the second node N2. The FET Q6 has its channel connected between the second node N2 and ground, and has its gate 9 connected to the first node N1.

The first voltage supply line VCC1 is preferably maintained at approximately five volts potential. The second voltage supply line VCC2 is preferably also kept at approximately five volts potential, except at a time just before the state of the non-volatile RAM element 22 is recalled, as is discussed below in connection with FIG. 3 and the Recall operation.

In the first stable state for the volatile RAM element 14, in which the voltage on the first node N1 is high relative to the second node N2, the depletion FET Q3 is on, i.e. in a highly conductive state, so the voltage of the first node N1 is essentially at the potential of the voltage source line VCC1, and the enhancement FET Q6 is turned on to pull the second node N2 to ground potential. This occurs because FET Q6 has a relatively low impedance in its on state compared to the relatively high impedance of second depletion FET Q4.

In the second stable state for the volatile element 14, in which the voltage on the second node N2 is high relative to the first node N1, the FET Q4 is on, to bring the voltage of the second node N2 to the potential of the second voltage supply line VCC2. The FET Q5 is also turned on by the raised voltage on the second node, drawing the voltage of the first node N1 to ground.

The state of the volatile memory element 14 may be changed by applying voltages to the data bus lines DB and DB' and gating the voltage signals to the nodes N1 and N2 by placing an address enable signal on the ADDRESS line 814 to turn I/O FETs Q1, Q2 on. The state of the volatile element 14 is set by placing an address enable signal on the ADDRESS line 814 to turn the I/O FETs Q1, Q2 on, and then sensing the voltage produced on the lines DB and DB'.

When the voltages on the supply lines VCC1 and VCC2 are both made zero, as when the power is removed from the cell, the stable state of the element 14 is not maintained and the information contents of the element 14 is lost; hence, the volatility of the RAM element 14.

The Transfer Control Circuit 16

The transfer control circuit 16 controls the back-and-forth transfer of electrical signals between the volatile memory element 14 and the non-volatile memory element 22. The control circuit 16 acts as two gates, the first (Q8) of which controls the transfer of information from the volatile element 14 to the non-volatile element 22, and the second (Q7) of which controls the transfer of information from the non-volatile element 22 to the volatile element 14. The first gate is controlled by external electrical signals supplied on signal line 852 and designated as signal S1. The second gate is also controlled by signal S1 on the same signal line. FIGS. 2 and 3 show signal S1 as a 5 V logic signal occurring during the second timing interval, T2, of a store cycle sequence. FIG. 8 shows the TIMING SIGNAL MEANS 816 as the source of signal S1 in the store sequence. FIG. 4 shows waveform (e) as the S1 signal having a predetermined voltage level, such as 5 V, and serving as a reset transfer signal in a second reset interval R2. FIG. 8 shows the source of waveform (e) to be RESET SIGNAL MEANS block 880 sourcing the RTS signal onto signal line 852 during the reset sequence.

The first gate of the transfer control circuit 16 comprises an n-channel enhancement mode FET Q8 having its channel connected between the first node N2 of the volatile RAM element 14 and a node N4 of the non-volatile element 22. This first transfer control gate governs the transfer of the state of the first node N2 of the volatile element 14 to the fourth node N4 in the non-volatile element 22 during the storing of the state of the volatile element in the non-volatile element.

A second gate function comprising Q7 of the transfer control circuit 16 controls the recall of the state of the non-volatile memory element 22 to the volatile memory element 14. Q7 is an enhancement mode FET connected between the sensing output line 21 of the non-volatile element and NODE N1 of the volatile element.

The sensing output line 21 of the non-volatile element 2 is connected to the drain sensing transistor Q13, which is responsive to a storage transistor Q14 to indicate the state stored in the non-volatile element 22, as will be described below in connection with the detailed description of the non-volatile element 22.

The gate of the FETs Q7 and Q8 are connected in parallel to the line S1 signal line. The gate of FETs Q13 and Q14 are connected in parallel to the line S2 signal line.

The Non-volatile Memory Element 870

The state of the memory cell 10 can be retained for extended periods of time in the non-volatile memory element 870. The non-volatile element 870 retains its state when power is removed from the circuit, unlike the volatile RAM CELL 14, which loses its state when the power is removed from the voltage input lines VCC1, VCC2. The non-volatile RAM element 870 has two states, which correspond to the two states of the volatile RAM CELL 14 when power is applied to lines VCC1 and VCC2.

The non-volatile RAM element 22 includes a charge storage memory 24 for retaining a charge representative of the state of the memory cell, and a rectifier pump Q10 and capacitor C1 for applying to the charge storage memory 24 the voltages necessary to program the appropriate state into the memory 24.

Figure 7:
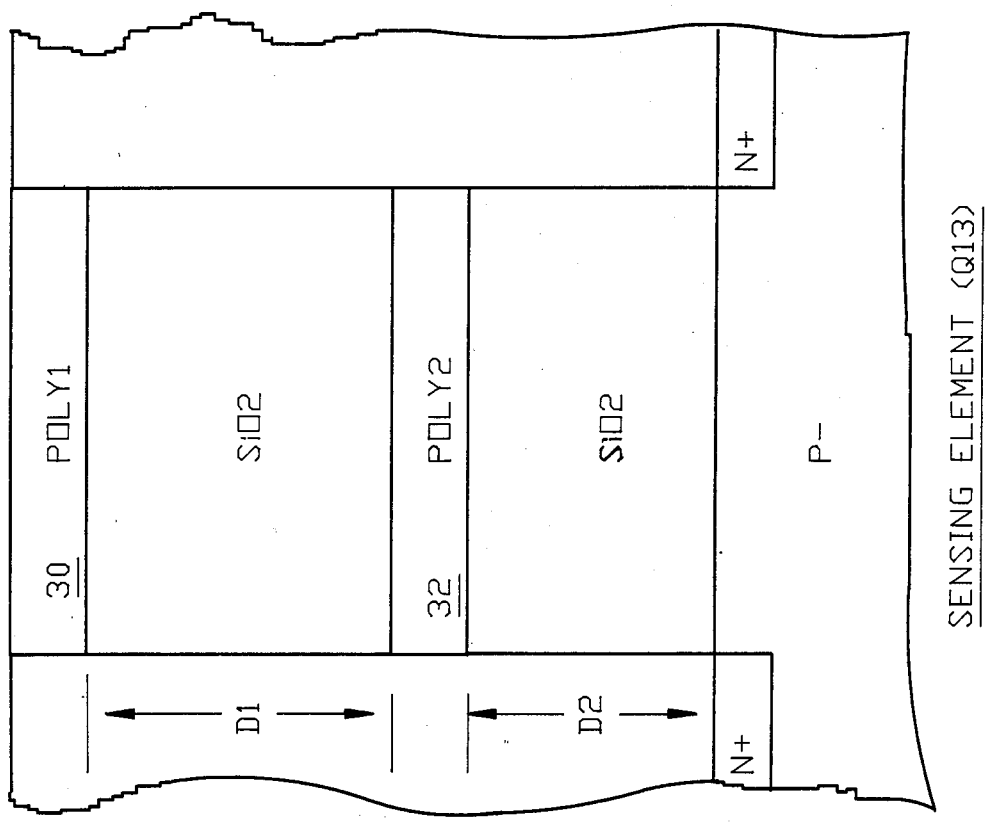
FIG. 7 is a schematic sectional view of a field effect transistor having a dielectrically isolated grid.
Figure 6:
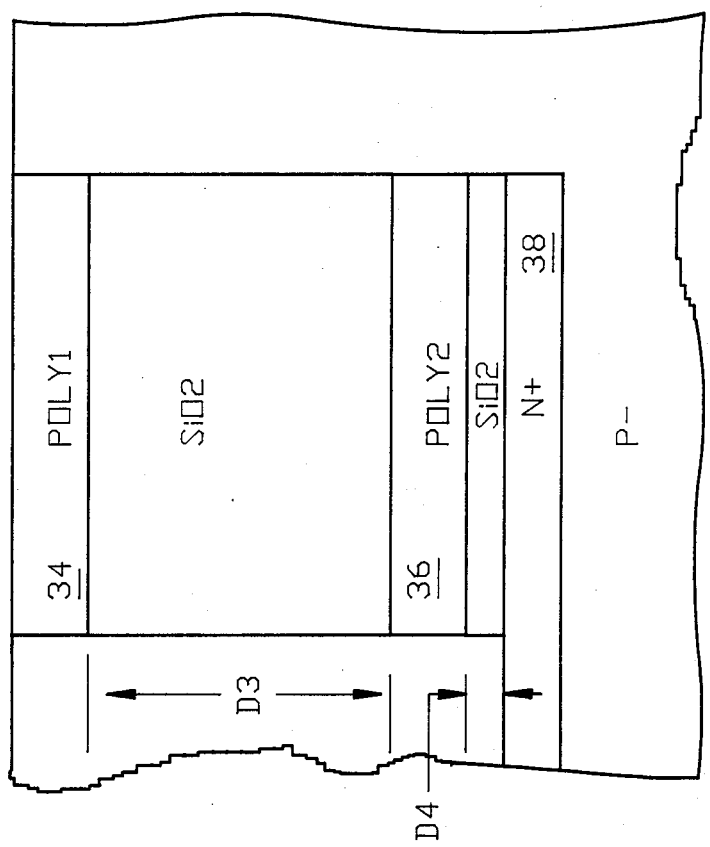
FIG. 6 is a schematic sectional view of a semiconductor charging structure for a dielectrically isolated grid.

The charge storage memory 24 has two nodes N3, N4, a non-volatile charge storage element Q14, and a sensing element Q13. The non-volatile charge storage element Q14 and the sensing element Q13 are preferably dielectrically isolated grid n-channel enhancement mode FETs. FIGS. 6 and 7 depict typical cross sections. The state of the volatile RAM element 14 to be stored in the memory 24 is received through the transfer control circuit 16 onto the nodes N4. To recall the state of the non-volatile RAM element 22 to the volatile element 14, the state of the charge storage memory 24 is output on the output line 20 to the volatile element 14 at node N1.

FIG. 6 is a schematic sectional representation of the cross section of the non-volatile charge storage element Q14. This Figure in conjunction with FIG. 1 shows that the storage element Q14 has a first plate 38, a second plate 34, and a dielectrically isolated grid 36 between the first plate 34 and the second plate 34. The first plate is represented by diffusion region 38. The second plate is represented by diffusion region 34 and the dielectrically isolated grid 36. The dielectric thickness D4 ($SiO_2$) between the dielectrically isolated grid 36 and the diffusion 38 is very thin (approximately 100 Angstroms) and the dielectric thickness D3 is typically in the range of 600 A° to 900 A°. By using a typical 20 V difference voltage between the plates, charges can be readily moved between the dielectrically isolated grid 36 and the diffusion 38.

A charge is stored on the dielectrically isolated grid 36 of the non-volatile charge storage element Q14 by applying a relatively high voltage of a first polarity (approximately 20 volts) between the second plate 34 and the first plate (diffusion 38). The charge is removed from the dielectrically isolated grid 36 by applying a relatively high voltage of a second polarity (approximately 20 volts) between the second plate 34 and the first plate (diffusion 38). The reference numbers on FIG. 7 are intended to correspond with those of FIG. 1 with regard to circuit nodes.

FIG. 7 is a schematic sectional representation of the cross section of sensing element Q13. This Figure in conjunction with FIG. 1 shows that sensing element Q13 also has a dielectrically isolated grid 32, a channel connected between the charge storage memory output terminal 50 and a predetermined voltage such as ground potential, and a control gate 30 coupled to the second plate 34 and to the S2 signal source to receive a recall output signal (ROS) such as that characterized by waveform (g) in FIG. 4, having an amplitude of 2.0 V in the second reset signal interval R2 from a RESET SIGNAL MEANS such as that characterized by block 880 in FIG. 8. The gate 30 is represented by POLY1 material. The dielectrically isolated grid is represented by POLY2. The separation D1 is typically in the range of 700 A° to 1000 A°. The separation D2 is typically in the range of 560 A° to 800 A°. The dielectric material is $SiO_2$. These dimensional ranges are intended to be by way of example and are not intended to be limiting since the voltage levels and timing intervals selected will influence the dimensions to be used.

The dielectrically isolated grid 32 of sense element Q13 is connected to the dielectrically isolated grid 36 of the storage element Q14 so the charge stored on the dielectrically isolated grid of the non-volatile charge storage element Q14 is transferred to the sensing element dielectrically isolated grid 32.

The charge on the dielectrically isolated grid 32 changes the threshold at which the sensing element Q13 is rendered conductive. For example, if a negative charge has been stored on the dielectrically isolated grid 36 of the non-volatile charge storage element Q14 and transferred to the dielectrically isolated grid 32 of the sensing element Q13, a larger positive voltage must be applied to the gate 30 to cause the channel of the sensing element Q13 to be conductive than would be the case if a positive charge were stored on the dielectrically isolated grid 32. The ability to alter the threshold voltage Q13 allows the sensing element Q13 to transfer the state of the non-volatile charge storage element member Q14 to the volatile RAM cell 14.

Referring TO FIGS. 2 and 3 and waveform (a), the high voltage source line HIV is connected to an external signal source of approximately 20 volts. Preferably, the twenty volts is obtained from the five volt source used in the memory circuit 10 by a capacitive voltage multiplier. FIG. 8 shows this signal source as block 816. It is understood that a recurrent timed signal sequence of signals at the onset of a store or recall sequence in which the signals are tailored to have amplitudes and durations selected to achieve the functions acquired in view of the silicon process (N or P) selected is a design choice of the designer and well within the prior art.

The Store Operation

Referring next to FIG. 2, waveforms for a partial store cycle operation of the RAM cell 10 are shown. The store cycle is used to transfer the state of the volatile RAM cell 14 to the non-volatile RAM element 22. The waveform (a) shows the electrical signal HIV provided by an external source (not shown) to the gate of rectifier FET Q10 of the NON-VOLATILE RAM ELEMENT 22.

Signal HIV assumes a high voltage of 20 V during a first interval T1 from t=0 to t=0.2 ms. The waveform (c) shows signal S2 going positive to 20 V and waveform (b) shows signal S1 remaining at zero volts during this same interval. By way of example, assume that the VOLATILE RAM CELL 14 has been preconditioned to store a logic "0" and is in a stable condition with a logic "1" (+5Vdc) at node N2 and a logic "0" (0.0 Vdc) at node N1.

Node N2 is common to the source 41 of Q8. FET Q8 is off (non-conductive) during this first store interval because its gate 39 is at 0.0 V dc by virtue of being coupled to signal S1 (waveform (b) is at 0.0 V during this interval) and its source is at +5 Vdc by virtue of its being coupled to node N2. With HIV at +20 V, and with Q8 acting as an open switch, current flows via MOS rectifier Q10 to node N4 driving the first plate 40 of MOS Capacitor C1 to a positive voltage of one VTH below +20 V (typically 18V). The rise in voltage of node 4 from 0.0 V to +18V is characterized by waveform (d) during this first 0.2 ms interval. The second plate 44 of MOS Capacitor C1 is at zero volts during interval T1 because it is coupled by conductor 46 to the signal source S1.

Since the second plate 34 of the storage element Q14 is coupled by conductor 29 to the S2 signal source, waveform (c), a small voltage difference of approximately .2V is developed between the storage first plate 38 and second plate 34 during this first 0.2 ms interval. Charge movement onto or off of dielectrically isolated grid 36 is not accomplished during this interval.

FIG. 2 shows that signals HIV and S2 (waveforms (a) and (c), respectively) return to zero volts during a second interval T2 from 0.2 ms to 0.6 ms. Signal S1 (waveform (b)) goes to +5V during this interval.

Referring to FIG. 2, waveform (d) shows an initial rise in the voltage at node 4 at the end of interval T1 from 18 V to 23V in response to signal S1 rising from 0.0 V to 5.0 V at the start of interval T2. The signal source for the signal S1 drives the voltage at node 4 by a path through conductor 46 to the second electrode of capacity C1, through the capacitor C1 to node 4. Waveform (d) shows a slight exponential decay during interval T2 that results from charge transfer into the dielectrically isolated grid 36.

Interval T3 extends from 0.6 ms to 1.0 ms. Signal S1 returns to 0.0 V and signal S2 returns to 20 V during interval T3. Waveform (d) shows that the return of S1 from 5.0 to 0.0 V at the start of T3 is coupled via capacitor C1 to node 4 and the result that node 4 is driven negatively to 15 V.

The return of Signal S2 to +20 V with node 4 at 15 V terminates the programming of storage element Q14.

The voltage of node N4 being substantially higher, during interval T2, than the voltage of the node N3, results in a positive charge being placed on the dielectrically isolated grid 36 of the storage device Q14. A net positive charge on the dielectrically isolated grid 36 of the storage element Q14 represents the state of the non-volatile element 22 for which node N3 has a lower potential than node N4, and this state corresponds also to the state of the volatile element 14 in which the potential of the first node N1 is lower than the potential of the second node N2.

The fourth interval T4 starts at 1.0 ms and ends at 1.1 ms and represents a wait interval until the start of the next successive partial store cycle. Each store cycle imparts an additional charge to isolated grid 36. An N-MOS embodiment would typically require nine or ten cycles to impart a sufficient charge change to isolated grid 36.

Waveform (e) in FIG. 2 schematically characterizes the successive shifts in the threshold voltage of sensing element Q13 in response to a reduction of negative charge from dielectrically isolated grid 36 by operation of non-volatile charge storage element 14. The shift in threshold voltage occurs during each successive T2 interval. FIG. 2 shows four partial storage intervals, each partial storage interval having a corresponding T1, T2, T3 and T4 interval. Waveform (e) in FIG. 2 shows the threshold voltage of Q13 being diminished from 3 V to approximately 1.6 V. In a typical system, nine or ten partial storage intervals would comprise the total storage interval and would decrease the threshold voltage of Q13 from 3.0 to approximately −1.5 V.

FIG. 3 shows waveforms for a partial store cycle operation wherein the volatile memory cell has been previously conditioned to store a logic "1". Waveform (a) again shows the electrical signal HIV provided by an external source (not shown) to the gate of FET Q10 of the N0N-V0LATILE RAM ELEMENT 22.

Signal HIV assumes a high voltage of 20 V during a first interval T1 from t=0 to t=0.2 ml. Waveform (b) shows signal S2 going positive to 20V and waveform (c) shows signal S2 remaining at zero volts during this same interval. By way of example, assume that the V0LATILE RAM CELL 14 has been preconditioned to store a logic "1" and is in a stable condition with a logic "0" (0.0 V ) at node N2 and a logic "1" (+5.0 V) at node N1.

Node N2 is common to the source of Q8. FET Q8 is off (non-conductive) during this first interval because its gate 39 is at 0.0 V dc by virtue of being coupled to signal S1 (FIG. 3, waveform b) and its source 41 is at +5 Vdc by virtue of its being coupled to node N2. With HIV at +20 V during T1, and with Q8 acting as an open switch, current flows via MOS rectifier Q10 to node N4 driving the first plate 40 of Capacitor C1 to a positive voltage of one VTH below +20 V (typically 18 V ). The rise in voltage of node N4 from 0.0 V to +18 V is characterized by waveform (d) of FIG. 3 during this first 0.2 ms interval. The second plate 44 of MOS Capacitor C1 is at zero volts during interval T1 because it is coupled by conductor 46 to the signal source S1.

Since the gate 34 of the storage element Q14 is coupled by conductor 29 to the S2 signal source, waveform c, also at +20 V, a small voltage difference of approximately 2 V is developed between the first plate 38 and second plate 34 during this T1 first 0.2 ms interval. Charge movement onto or off of dielectrically isolated grid 36 is not accomplished during this interval.

FIG. 3 shows that signals HIV and S2 (waveforms (a) and (c), respectively) return to zero volts during a second interval T2 from 0.2 ms to 0.6 ms. Signal S1 (waveform (b)) goes to +5 V during this interval.

Referring to FIG. 3, waveform (d) shows the voltage at node N4 at the end of interval T1 dropping from 18 V to 0.0 V in response to signal S1 rising from 0.0 V to 5.0 V at the start of interval T2. This drop in voltage results from signal S1 (waveform b) holding the gate of enhancement mode FET Q8 at +5.0 V during T2 while node N2 remains at 0.0V and grounded through FET Q6. FET Q8 is driven into a conductive state by operation of S1. A conductive path is present from node N4, through the channel of Q8, through the channel of Q6 by way of which capacitor C1 is discharged. Waveform (d) shows a slight exponential rise at the conclusion of interval T2 that results from capacitive coupling to node N4 by signal S2 (waveform c) returning to +20 V.

The return of Signal S2 to +20 V at node N3 coupled with node 4 at 1.0 V continues the programming of storage element Q14.

Node N3 being substantially higher, during interval T2, than the voltage of the node N4, results in a negative charge being placed on the dielectrically isolated grid 36 of the storage device Q14. A negative charge on the dielectrically isolated grid 36 of the non-volatile charge storage element Q14 represents the state of the non-volatile RAM element 22 for which node N4 has a lower potential than node N3. This state corresponds also to the state of the volatile element 14 in which the potential of the first node N1 is higher than the potential of the second node N2.

The fourth interval T4 starts at 1.0 ms and ends at 1.1 ms and represents a wait interval until the start of the next successive partial store cycle.

Waveform (e) in FIG. 2 schematically characterizes the successive positive shifts in the threshold voltage of sensing element Q13 in response to a reduction of negative charge onto dielectrically isolated grid 36. The shift in threshold voltage occurs during each successive T2 interval. FIG. 2 shows four partial storage intervals, each partial storage interval having a corresponding T1, T2, T3 and T4 interval. Waveform (e) in FIG. 3 shows the threshold voltage of Q13 being increased from −1.5 V to approximately 2.1 V. In a typical system, nine or ten partial storage intervals would comprise the total storage interval and would increase the threshold voltage of Q13 from 1.5 V to approximately 3.0 V.

With the voltage at the third node N3 high and the voltage on the fourth node N4 low, negative charges move from the diffusion 38 of the transistor Q14 onto the dielectrically isolated grid 36. Keeping the high voltage across the storage element Q14 for the intervals including T2 and T4 of approximately 0.8 milliseconds programs the dielectrically isolated grid 36. Thus, a negative charge on the dielectrically isolated grid of the non-volatile storage element Q14 represents the state of the non-volatile element in which the node N3 has a higher potential than does the node N4, which in turn represents the state of the volatile RAM element 14 in which the node N1 has a higher potential than does the second node N2.

The charge on the dielectrically isolated grid 36 of the storage device Q14 of the memory element 24 represents the stored state of the memory cell 10. That charge remains in place after power is removed from the cell circuit for an indefinite length of time. Therefore, the state of the non-volatile RAM element 22 is retained after the device containing the memory is powered down.

The Recall Operation

Referring next to FIG. 4, waveforms for a recall cycle operation of the non-volatile memory RAM cell 10 are shown. A recall cycle is used to transfer the state of the non-volatile RAM element 22 to the volatile memory element 14. The HIV signal (waveform (a)) remains at 0.0 V during the RECALL cycle. Waveform (b) shows the VCC1 signal provided by an external voltage supply (not shown) on the voltage supply line VCC1 connected to drain 15 of FET Q4. Waveform (c) shows the VCC2 signal provided by a convention signal source such as that represented by the RESET SIGNAL MEANS block 880 sourcing a memory reset signal on signal line 818 to reset terminal 826, to the drain 13 of Q4 as shown in FIG. 1. Referring to FIG. 4, waveform (c) shows the signal voltage at node N2 in response to application of signal VCC2 to the drain 13 of Q4. Waveform (c) shows the signal voltage at node N1 in response to application of signal VCC2 to the drain 15 of Q4 with VCC1 applying +5 to the drain 15 of Q3. Waveform (f) shows the electrical signal S1 provided by an external source such as the RESET SIGNAL MEANS block 880 of FIG. 8 on signal line 852 to control the RECALL TRANSFER by switching the gate 26 of Q7 to +5 V in the transfer control circuit 16 of FIG. 1. Waveform (g) shows signal S2 making an excursion between zero and two volts. This signal is the RECALL OUTPUT SIGNAL (ROS) from the RESET SIGNAL MEANS block 880 of FIG. 8 via signal line 29 to the gate of sense element Q3.

To recall the state of the memory from the non-volatile RAM element 22 and place it into the volatile RAM cell 14 for general use and retrieval through the data lines DB and DB' the volatile RAM cell is first placed in a predetermined state by operation of the VCC2 signal. The sensing element Q13 senses the state of the storage element Q14 and, in response, causes the volatile element to either remain in the established predetermined state, or to flip to the other stable state. Since Q13 can only provide a sink path to node N1, the predetermined state of the flip-flop must be such as to establish a high or logic 37 1" at node N1.

To perform the recall function in the preferred embodiment shown, during interval R1, the input voltage VCC2 is brought low for approximately one microsecond to force the first node N1 of the volatile element high and place the volatile element in its stable state in which the first node N1 is high and the second node N2 is low. During a subsequent interval, R2, the signal on the S1 line is brought high for approximately one microsecond to cause the transistor Q7 of the transfer control circuit 16 to be conductive.

The charge on the dielectrically isolated grid 36 of the storage element Q14 is also present on the dielectrically isolated grid 32 of the sensing element Q13. The charge on the dielectrically isolated grid 32 affects the threshold voltage of the sensing transistor Q13. That effect on the threshold voltage is used to transfer the state of the charge storage memory 24 via Q7 to the volatile memory 14.

A negative charge on the dielectrically isolated grid 32, which corresponds to a negative charge on the dielectrically isolated grid 36 of the storage device Q14, raises the threshold voltage of the sensing transistor Q13 to greater than 3 V so the S2 signal voltage [FIG. 4 waveform (g)] is insufficient to render the transistor Q13 conductive.

Conversely, a positive charge on the dielectrically isolated grid 32 lowers the threshold voltage of the device Q13 sufficiently (i.e. to less than −1.5 V) so that the S2 signal voltage applied to the node N3 ensures that the transistor Q13 is conductive. The positive charge applied during the store operation is sufficient to turn the transistor Q13 on but without consequence since Q7 is not on at the same time.

Signal voltage S2 is applied to the control gate 30 of the sense element Q13. That bias voltage is either above or below the threshold for the transistor Q13. If the S2 signal voltage is below the threshold voltage, transistor Q13 remains off, and the output line 20 is not connected to ground.

FIG. 4 waveform (g) is observed to be more positive than −1.5 V at all times including the interval during which it rises to 2.0 V. However, the conductivity of the Q13 sense element is insufficient when its threshold is at −1.5 V and its gate is at 0.0 V to sink sufficient current to alter the state of the flip-flop 14.

If the S2 signal voltage applied to the control gate 30 is above the threshold, transistor Q13 is turned on very hard. With the transistor Q13 very conductive, the sense output line 20 is brought low to ground potential.

As was discussed above, a negative charge stored on the dielectrically isolated grid 36 of the storage device Q14, represents the state in which the node N3 is at a higher potential than the node N4, which corresponds to the volatile memory state in which the potential of the node N1 is higher than the potential of the node N2. Thus, it is seen that state of the volatile element stored in the non-volatile memory is restored to the volatile element flip-flop 14.

If the sense transistor Q13 is on when the gate transistor Q7 is rendered conductive, the sense output line 20 is connected to the ground potential and the first node N1 is pulled low, and the volatile element 14 is flipped from its pre-established state. The storage of a positive charge on the dielectrically isolated grid 36 of the storage device Q14 represents the state in which the potential of the node N4 is higher than the potential of the node N3 in the non-volatile element, which corresponds to the state of the volatile element in which the second node N2 has a higher potential than the first node N1. Thus, it is seen that the state stored in the storage device Q14 is restored to the volatile element 14 during the recall operation.

I claim:

1. A memory cell circuit for storing the first or second state of a digital signal on a data bus in response to being addressed by an address signal on an address bus,
said memory cell having a store cycle each store cycle having a repeating series of recurring stored cycle sequences, each store cycle sequence having a (HIV) timing signal during a first timing interval, and first and second store timing signals during second and third timing intervals from a timing signals means for the control of said store cycle sequence;
said memory cell circuit also having a recall cycle, each recall cycle having a memory reset signal to pre-set the state of the memory cell circuit during a first reset signal interval, a recall output signal at a predetermined voltage level and RECALL TRANSFER signal in a second reset signal interval from a RESET SIGNAL MEANS to control a recall timing sequence, said memory cell comprising:
a volatile RAM cell having a flip-flop providing an output signal at an output terminal, said output signal being characterized to assume a first or second stable state corresponding to the state of the data bus in response to an address signal on the address bus,
said flip-flop also having a reset terminal responsive to said memory reset signal for forcing the flip-flop to assume a predetermined state in response to said memory reset signal and a set terminal responsive to a set signal for setting the state of said volatile RAM cell in said recall timing sequence;
a non-volatile RAM element having:
a rectifier capacitor means responsive to said high voltage timing signal in said store cycle [timing signal] sequence for precharging a capacitor to a first state during the first timing interval of each store cycle sequence; and
transfer control circuit means responsive to said first store timing signal to discharge said capacitor in response to said flip-flop output signal being in a first state and allowing said capacitor to remain precharged in response to said flip-flop output signal being in a second state;
a charge storage memory responsive to the charge state of said capacitor and to said second store timing signal for storing a state corresponding to the charge state of said capacitor into a non-volatile charge storage element;
said charge storage memory being responsive to said recall output signal in said recall timing sequence to provide a set signal having a state corresponding to the stored state of said capacitor;
said transfer control circuit means being responsive to said RECALL TRANSFER signal to couple said set signal to said set terminal to set the state of said flip-flop during said recall timing signal sequence to state corresponding to the charged state of said non-volatile storage element;
whereby, said flip-flop provides, said output signal at its output terminal representing the charged state of said non-volatile charge storage element.

2. The memory cell circuit of claim 1 wherein said charge storage memory non-volatile charge storage element further comprises:
a dielectrically isolated grid having a charge established in response to the charge state of said capacitor following said second timing interval in a store cycle sequence;
said dielectrically isolated grid charge characterizing the previously stored state of said non-volatile RAM element, and
a sense element means responsive to said recall output signal and to the charge on said dielectrically isolated grid for providing said set signal.

3. The memory cell circuit of claim 1 wherein said non-volatile RAM element rectifier capacitor means further comprises:
a capacitor having a first and second terminal, and a rectifier;
said rectifier being responsive to said high voltage timing signal in said store timing sequence for conducting current in a first direction to said capacitor first terminal,
said capacitor second terminal being coupled by said second timing signal B2 to a reference potential such as ground during said first timing interval,
said high voltage timing signal being further characterized to charge on said capacitor during said second and third timing intervals.

4. The memory cell circuit of claim 1 wherein said non-volatile RAM element rectifier capacitor means further comprises:
a capacitor having a first and second terminal; and
wherein, said transfer control circuit means during said store cycle second timing interval couples said capacitor first terminal to said flip-flop output terminal to discharge said precharged capacitor in response to said flip-flop being in a first state and to not discharge said capacitor in response to said flip-flop being in a second state.

5. The memory cellcircuit of claim 1 wherein: said charge storage memory further comprises:
a non-volatile charge storage element having:
a dielectrically isolated grid, a first plate and a second plate, and
wherein said non-volatile RAM element rectifier capacitor means has a capacitor having a first and second terminal;
said first plate being coupled to said capacitor first terminal and said second plate being coupled to said store cycle sequence second timing interval, and
a sensing element having a floating grid FET having a floating gate coupled to the dielectrically isolated grid of said non-volatile charge storage element said FET having its channel coupled via said transfer control circuit means between a reference potential and said flip-flop set terminal;

whereby, said charge storage memory provides said set signal from said flip-flop set terminal.

6. The memory cell circuit of claim 2 wherein said non-volatile RAM element charge storage memory sensing element means further comprises:

a field effect transistor having a dielectrically isolated grid responsive to the charge on said dielectrically isolated grid and a gate coupled to receive said recall output signal for selectively establishing a predetermined voltage on said non-volatile element output terminal.

7. The memory cell circuit of claim 2 wherein said sense element means further comprises:

a field effect transistor having a dielectrically isolated grid responsive to the charge on said dielectrically isolated grid and a gate coupled to receive said recall output signal for selectively establishing a predetermined voltage on a non-volatile RAM element output terminal; and wherein said transfer control circuit means further comprises a RECALL FET, said RECALL FET having a gate and a conduction channel having a first and second terminal;

said RECALL FET gate being responsive to said RECALL TRANSFER signal to coupled said set signal from non-volatile RAM element output terminal to said flip-flop set terminal.

8. The memory cell circuit of claim 1 wherein:

said charge storage memory within said non-volatile RAM element further comprises:

a non-volatile charge storage element having:
a dielectrically isolated grid,
a first plate and
a second plate, and wherein said non-volatile RAM element rectifier capacitor means has:

a capacitor having a first and second terminal;

said non-volatile charge storage element first plate being coupled to said capacitor first terminal and said second plate being coupled to said second timing signal, and a sensing element having a floating gate MOSFET having:
a gate,
a conduction channel, and
a dielectrically isolated grid
coupled to the dielectrically isolated grid of said non-volatile RAM element and having its channel coupled between a reference potential and a non-volatile RAM element output terminal, said sensing element being responsive to the charge on said dielectrically isolated grid and its gate being coupled to receive said recall output signal for selectively sourcing said set signal as a predetermined voltage on said non-volatile RAM element output terminal.

9. The memory cell circuit of claim 8 wherein said transfer control circuit means further comprises:

a RECALL FET, said RECALL FET having a gate and a conduction channel having a first and second terminal, said RECALL FET gate being responsive to said RECALL TRANSFER signal to couple said non-volatile RAM element output terminal to said flip-flop set terminal.

10. A memory cell circuit for storing the first or second state of a digital signal on a data bus in response to being addressed by an address signal on an address bus;

said memory cell having a store cycle each store cycle having a repeating series of recurring store cycle sequences, each store cycle sequence having a (HIV) high-voltage timing signal during a first interval, and first and second store timing signals during second and third timing intervals in a store cycle sequence from a timing signal means for the control of a store cycle timing sequence;

said memory cell circuit also having a recall cycle, each recall cycle having a memory reset signal to pre-set the state of the memory cell circuit during a first interval, a recall output signal at a predetermined voltage level and a RECALL TRANSFER signal in a second reset signal interval from a RESET SIGNAL MEANS to control a recall timing sequence, said memory cell comprising:

a volatile RAM cell having a flip-flop providing an output signal at an output terminal, said output signal being characterized to assume a first or second stable state corresponding to the state of the data bus in response to an address signal on the address bus in the store timing sequence from said timing signal means;

said flip-flop also having a reset terminal responsive to a memory reset signal for forcing the flip-flop to assume a predetermined state, and a set terminal responsive to a set signal for setting the state of said flip-flop cell in a recall sequence;

a non-volatile RAM element having:

a rectifier and capacitor means responsive to said high voltage timing signal in said store timing signal sequence for precharging a capacitor having a first and second terminal to a first state at the start of each store cycle;

said rectifier means having a field effect transistor having a conduction channel having a first and second terminal and a gate, said first terminal being coupled to said capacitor first terminal, said second terminal being coupled to said field effect transistor gate and to said high voltage input signal source;

a charge storage memory responsive to the charge state of said capacitor and to said store sequence second store timing signal for transferring the state of said flip-flop into a non-volatile charge storage element, said charge storage memory being responsive to said recall output signal in said recall timing sequence to provide a set signal having a state corresponding to the stored state of said capacitor;

said transfer control circuit means being responsive to said first timing signal in said store cycle sequence to discharge said capacitor in response to said flip-flop being in a first state and allowing said capacitor to remain precharged in response to said flip-flop output signal being in a first state;

said transfer control means also having a RECALL FET (field effect transistor), said RECALL FET having a gate and a conduction channel having a first and second terminal;

said RECALL FET gate being responsive to said first recall timing signal to couple said non-volatile element output terminal to said volatile RAM flip-flop set terminal to set the state of said flip-flop to a state corresponding to the charged state of said charge storage device.

11. A memory cell circuit for storing the first or second state of a digital signal on a data bus in response to being addressed by an address signal on an address bus;

said memory cell having a store cycle each store cycle having a repeating series of recurring store cycle sequences, each store cycle sequence having a (HIV) high-voltage timing signal during a first interval, and to first and second store timing signals during second and third timing intervals in a store cycle sequence from a timing signal means for the control of a store cycle timing sequence;

said memory cell circuit also having a recall cycle, each recall cycle having a memory reset signal to pre-set the state of the memory cell circuit during a first interval, a recall output signal at a predetermined voltage level and a RECALL TRANSFER signal in a second reset signal interval from a RESET SIGNAL MEANS to control a recall timing sequence, said memory cell comprising:

a volatile RAM cell having a flip-flop providing an output signal at an output terminal, said output signal being characterized to assume a first or second stable state corresponding to the state of the data signal on the data bus, in response to an address signal on the address bus in a store timing sequence, said flip-flop having:

a reset terminal responsive to a recall cycle memory reset signal for forcing the flip-flop to assume a predetermined state in response to said memory reset signal; said flip-flop further comprises:

first and second I/0 FETS (field effect transistors (Q2, Q1)), each FET having a respective gate, source and drain, said first and second I/O FET having respective drains coupled to respective complementary data bus signal lines, the gates of said I/O FETS being coupled to said address signal line, said flip-flop also having:

first and second P/U (pull up) FETS (Q4, Q3) and first and second state FETS (Q6, Q5), said first P/U FET drain being coupled to said flip-flop reset terminal to receive said memory reset signal (VCC2), said second P/U FET drain being coupled to a constant supply voltage source (VCC1), said first state FET drain being coupled to said first P/U FET source and gate, to said second state FET gate, to said first I/O FET source and to said flip-flop set terminal;

said second state FET drain being coupled to said second P/U FET source and gate, to said first state FET gate, to said second I/O FET source and to said flip-flop output terminal (N1);

a non-volatile RAM element having:

a reset TRANSFER FET (Q7) and a discharge FET (Q8);

a capacitor (C1) having a first and second terminal;

a charge storage element (Q14) having a dielectrically isolated grid, a first and second plate; and a sensing element FET (Q13) having a dielectrically isolated grid; said dielectrically isolated grids being electrically coupled to said charge storage element dielectrically isolated grid, the charge on said dielectrically isolated grid being characterized to shift the threshold voltage;

each FET having a source, a gate and a drain;

said RECALL FET drain being coupled to said flip-flop set terminal;

said discharge FET source being coupled to said flip-flop output terminal;

said recall and discharge FET gates being coupled to receive said first store and said first RECALL TRANSFER signals during the second interval in respective store and recall timing sequences, said capacitor having a first terminal coupled to said discharge FET drain, to the source of the rectifier FET and to the first plate of said non-volatile RAM element;

said capacitor second terminal being coupled to the junction of said TRANSFER FET grids;

the second plate of said non-volatile RAM element being coupled to the gate of said sensing element FET and to the source of said second store and recall output timing signals;

the source of said sensing element FET being coupled to a reference potential such as ground, and the drain of said sensing element being coupled to the source of said RECALL FET.

* * * * *